(12) United States Patent
Yamashima et al.

(10) Patent No.: US 11,864,362 B2
(45) Date of Patent: *Jan. 2, 2024

(54) POWER SUPPLY DEVICE WITH A HEAT GENERATING COMPONENT

(71) Applicant: Panasonic Intellectual Property Management Co., Ltd., Osaka (JP)

(72) Inventors: Atsushi Yamashima, Kanagawa (JP); Shinya Kimura, Aichi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/724,345

(22) Filed: Apr. 19, 2022

(65) Prior Publication Data

US 2022/0256730 A1 Aug. 11, 2022

Related U.S. Application Data

(63) Continuation of application No. 17/072,917, filed on Oct. 16, 2020, now Pat. No. 11,330,742, which is a
(Continued)

(30) Foreign Application Priority Data

Apr. 25, 2018 (JP) ................................ 2018-084184

(51) Int. Cl.
*H05K 7/20* (2006.01)
*H02M 3/00* (2006.01)

(52) U.S. Cl.
CPC ......... *H05K 7/209* (2013.01); *H05K 7/20409* (2013.01); *H05K 7/20445* (2013.01); *H05K 7/20509* (2013.01); *H02M 3/003* (2021.05)

(58) Field of Classification Search
CPC ...... H05K 7/2039–20518; H05K 7/2089–209; H02M 3/00; H02M 1/00; H02M 7/48
See application file for complete search history.

(56) References Cited

U.S. PATENT DOCUMENTS

| | | | |
|---|---|---|---|
| 6,058,012 A | 5/2000 | Cooper et al. | |
| 8,705,242 B2 | 4/2014 | Abe et al. | |

(Continued)

FOREIGN PATENT DOCUMENTS

| | | |
|---|---|---|
| CN | 102255539 A | 11/2011 |
| DE | 102007054618 A1 | 6/2008 |
| JP | 2017-108007 A | 6/2017 |

OTHER PUBLICATIONS

International Search Report, dated Jun. 18, 2019, for International Application No. PCT/JP2019/015884, 2 pages.
(Continued)

*Primary Examiner* — Zachary Pape
(74) *Attorney, Agent, or Firm* — Seed IP Law Group LLP

(57) ABSTRACT

This power supply device is provided with: a first heat-generating component; a case; a resin material; a circuit board; a second heat-generating component; and a heat dissipation casing. This power supply device is additionally provided with a heat transfer member which has a first portion that is arranged to be in contact with a first outer surface of the case and a second portion that is arranged to be in contact with a second outer surface of the case, and which has a higher thermal conductivity than the case. The second heat-generating component is arranged in contact with the heat transfer member; and the heat transfer member dissipates the heat of the first heat-generating component and the second heat-generating component by being arranged in contact with a wall surface that constitutes the heat dissipation casing.

19 Claims, 11 Drawing Sheets

Related U.S. Application Data continuation of application No. PCT/JP2019/015884, filed on Apr. 12, 2019.

(56) References Cited

U.S. PATENT DOCUMENTS

| | | | |
|---|---|---|---|
| 8,907,758 B2 * | 12/2014 | Nomura | H01F 27/022 336/212 |
| 9,349,511 B2 | 5/2016 | Inaba et al. | |
| 11,330,742 B2 * | 5/2022 | Yamashima | H05K 7/20509 |
| 2008/0117602 A1 | 5/2008 | Korich et al. | |
| 2011/0286185 A1 | 11/2011 | Abe et al. | |
| 2013/0257680 A1 | 10/2013 | Nix et al. | |
| 2015/0170817 A1 | 6/2015 | Yamashima et al. | |
| 2015/0208556 A1 | 7/2015 | Kodama et al. | |
| 2018/0174733 A1 | 6/2018 | Matsutani et al. | |
| 2020/0176168 A1 | 6/2020 | Tanabe et al. | |

OTHER PUBLICATIONS

English Translation of German Office Action dated Jul. 6, 2023, for the corresponding German Patent Application No. 112019002133.8, 4 pages.

English Translation of Chinese Office Action dated Oct. 26, 2023, for corresponding Chinese Patent Application No. 201980027786.7, 9 pages.

* cited by examiner

ID. US 11,864,362 B2

POWER SUPPLY DEVICE WITH A HEAT GENERATING COMPONENT

TECHNICAL FIELD

The present disclosure relates to a power supply apparatus.

BACKGROUND ART

In recent years, in a power supply apparatus used for an inverter or the like mounted in an electric vehicle or the like, the output of an electronic component of a semiconductor or the like mounted in a circuit board has been increased, and accordingly the power loss in the electronic component has been increased. As a result, the electronic component tends to generate heat, and as such it is desired to efficiently dissipate the heat of the electronic component.

For example, PTL 1 discloses a power supply apparatus that dissipates the heat of an electronic component with an aluminum block (heat transfer member) disposed in a heat dissipation housing. More specifically, in the power supply apparatus, the heat of a first heating member (e.g., a field effect transistor (FET)) attached in contact with a side wall of the heat transfer member and a second heating member (e.g., a reactor) housed in the heat transfer member is transferred to the heat dissipation housing in contact with the transfer member so as to dissipate the heat.

CITATION LIST

Patent Literature

PTL 1
Japanese Patent Application Laid-Open No. 2017-108007

SUMMARY OF INVENTION

Technical Problem

However, in the configuration disclosed in PTL 1, the thickness of the side wall and the like of the heat transfer member is required to be increased, and in turn, the installation area for the heat transfer member is required to be ensured for the purpose of improving the heat-dissipation performance when the thermal conductivity of the heat transfer member (aluminum block) is taken into consideration. That is, the configuration disclosed in PTL 1 has a room for improvement in downsizing of the entire apparatus.

An object of the present disclosure is to provide a power supply apparatus that can reduce the size of the entire apparatus while ensuring the heat-dissipation performance of the heating member.

Solution to Problem

A power supply apparatus according to the present disclosure includes a first heating member; a case having a box shape whose one surface is open, the case being configured to house the first heating member; a resin material provided inside the case, and configured to transmit heat of the first heating member to the case; a circuit board; a second heating member connected to the circuit board; and a heat dissipation housing configured to house the case, the circuit board and the second heating member and dissipate heat of the first heating member and the second heating member. The power supply apparatus further includes a heat transfer member having a thermal conductivity higher than that of the case, the heat transfer member including a first portion disposed in contact with a first outer surface of the case, and a second portion disposed in contact with a second outer surface of the case. The second heating member is disposed in contact with the heat transfer member. When disposed in contact with a wall surface of the heat dissipation housing, the heat transfer member dissipates the heat of the first heating member and the second heating member.

Advantageous Effects of Invention

According to the present disclosure, it is possible to reduce the size of the entire apparatus while ensuring the heat-dissipation performance of the heating member.

DESCRIPTION OF EMBODIMENTS

Figure 1:
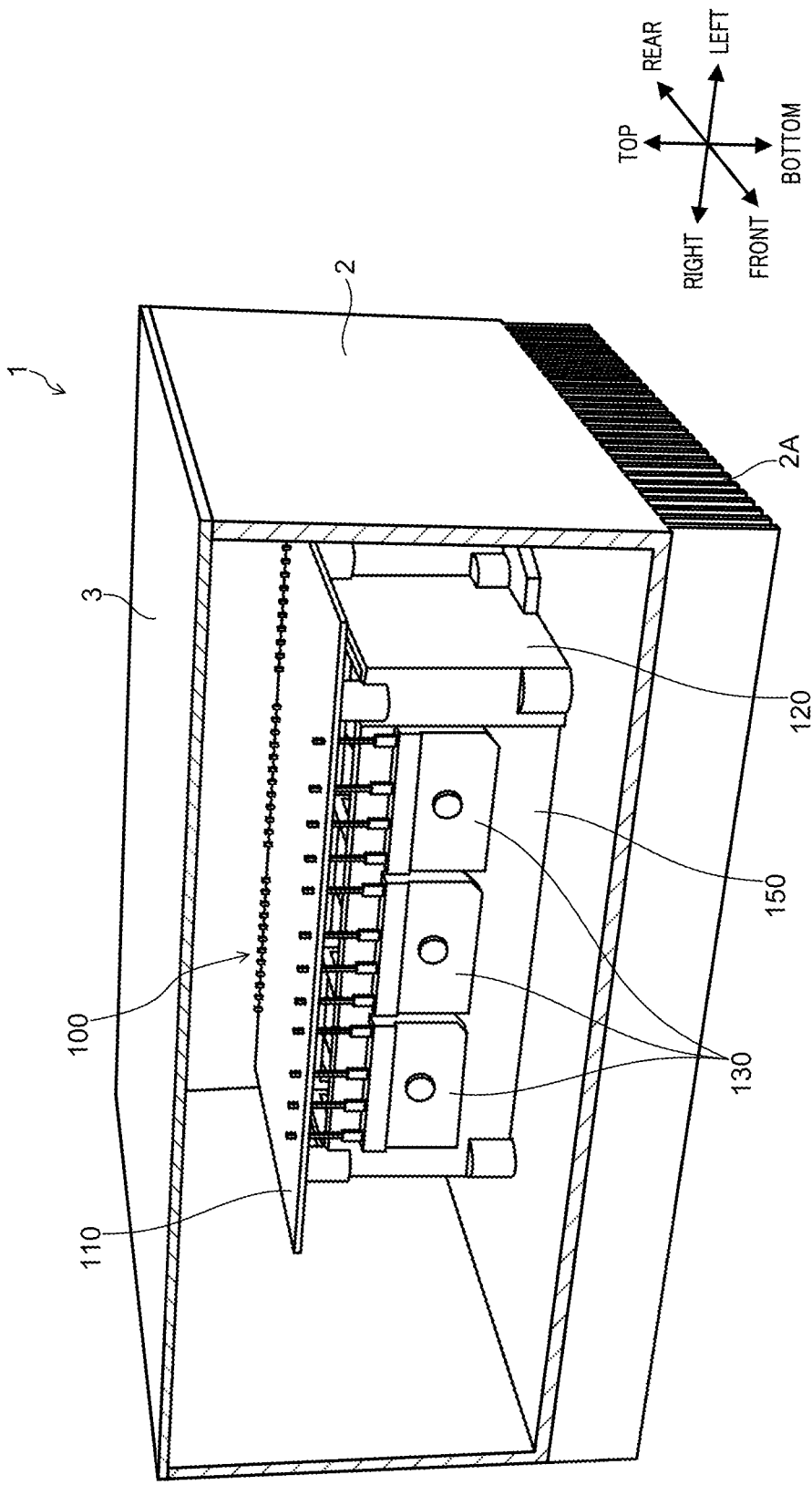
FIG. 1 is a perspective view of a power supply apparatus according to an embodiment of the present disclosure.
Figure 2:
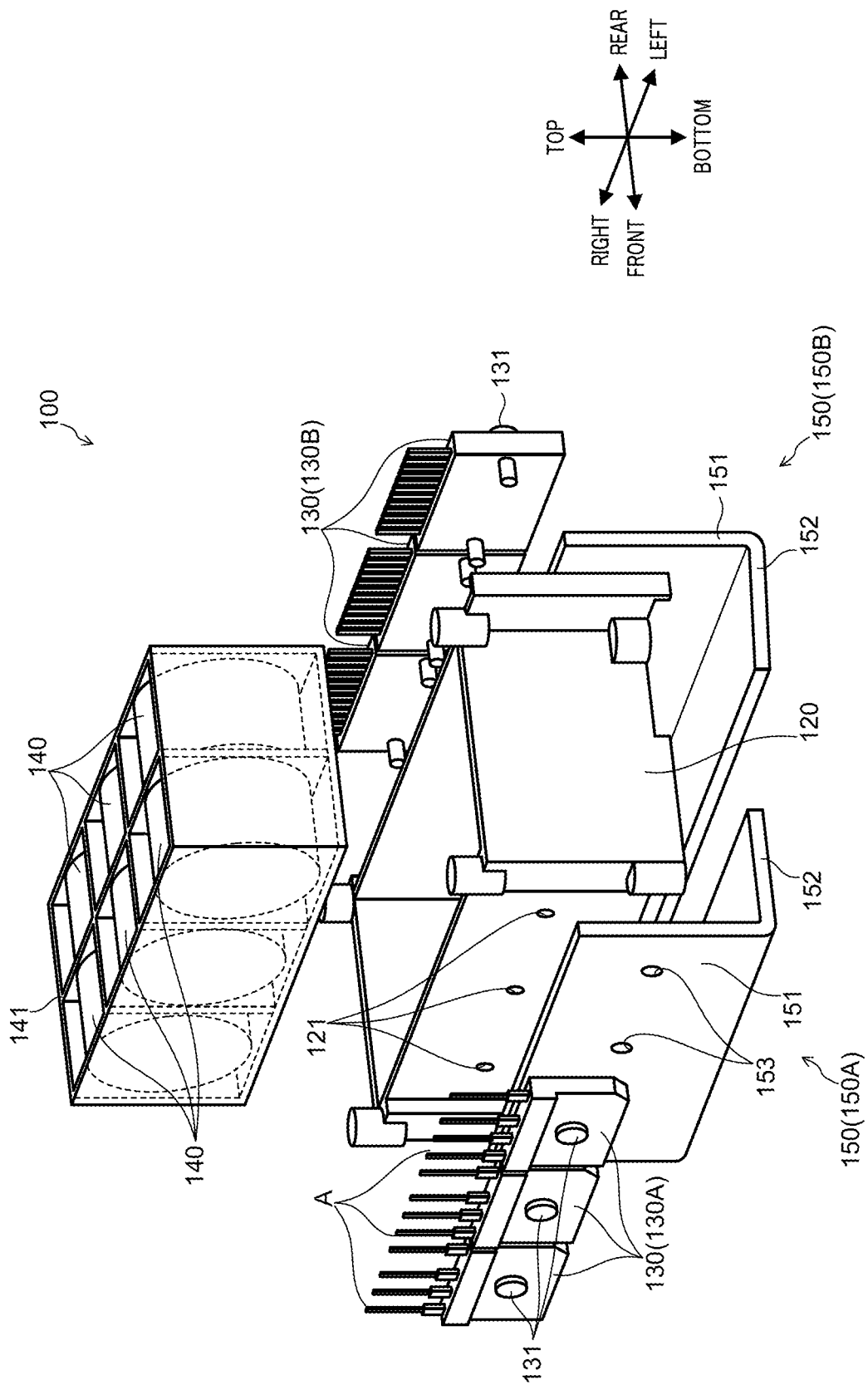
FIG. 2 is an exploded perspective view of a power conversion apparatus.
Figure 3:
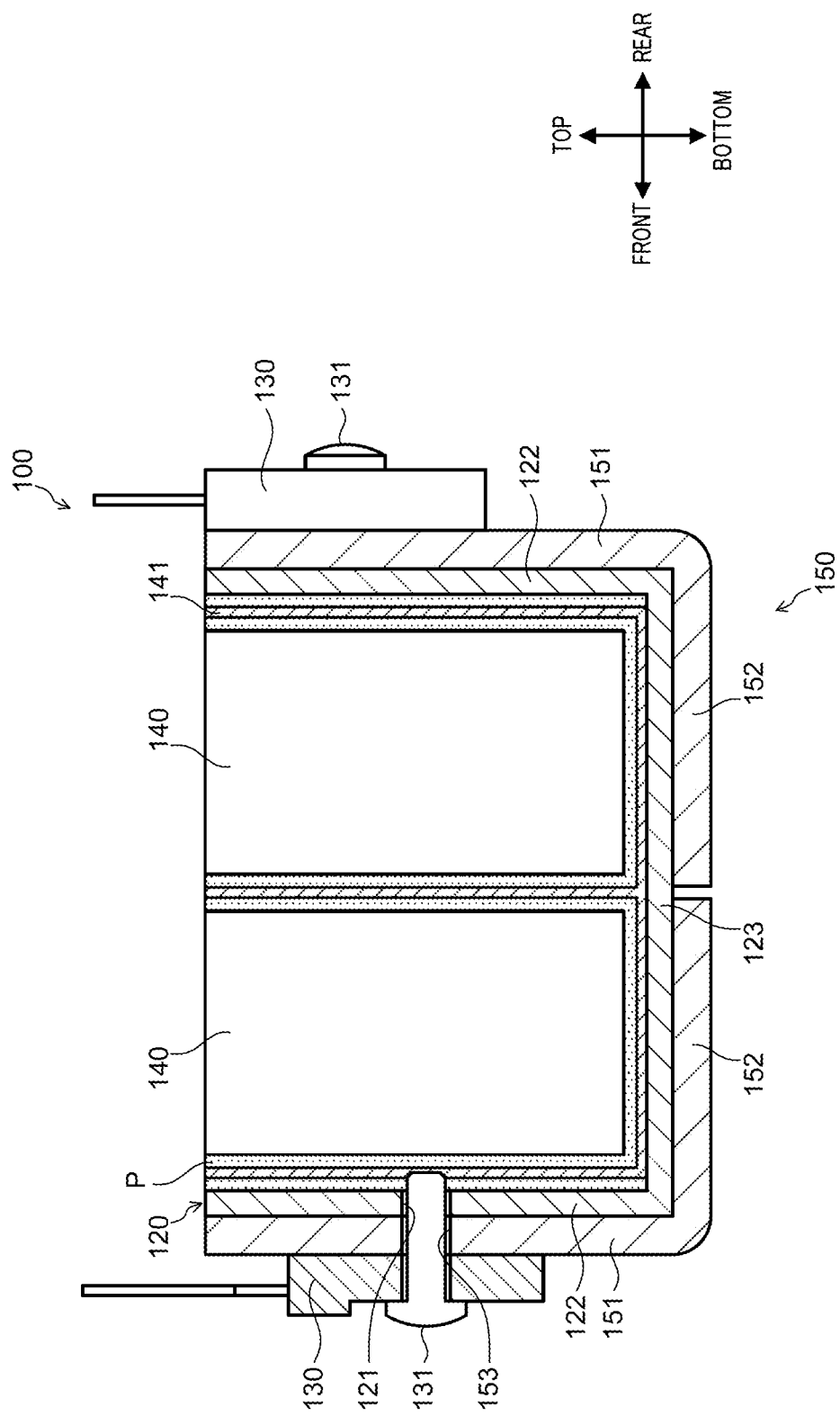
FIG. 3 is a side sectional view the power conversion apparatus.

An embodiment of the present disclosure is elaborated below with reference to the accompanying drawings. FIG. 1 is a perspective view of power supply apparatus 1 according to an embodiment of the present disclosure. FIG. 2 is an exploded perspective view of power conversion apparatus 100. FIG. 3 is a side sectional view of power conversion apparatus 100.

As illustrated in FIG. 1, power supply apparatus 1 is used for an in-vehicle charger, an inverter and the like mounted in an electric vehicle and the like, and includes heat dissipation housing 2, lid 3, and power conversion apparatus 100.

Heat dissipation housing 2 has a cuboid shape composed of a bottom wall and four side walls, and is formed in a box shape that opens upward. Heat dissipation housing 2 is composed of a member having an excellent thermal conductivity (e.g., aluminum, iron, copper, and magnesium), and dissipates heat of power conversion apparatus 100 housed inside. Fin 2A is formed in the bottom wall of heat dissipation housing 2. Lid 3 covers the opening of heat dissipation housing 2. Note that FIG. 1 illustrates a sectional view of heat dissipation housing 2 taken along a plane perpendicular to the front-rear direction.

Power conversion apparatus 100 is housed in the state where power conversion apparatus 100 is in contact with the inner bottom surface of the bottom wall of heat dissipation housing 2 (a wall surface constituting heat dissipation housing 2). Power conversion apparatus 100 includes circuit board 110, case 120, electronic component 130 as an example of a second heating member, reactor 140 as an example of a first heating member (see FIG. 2), and heat transfer member 150.

Circuit board 110 is a board in which a predetermined wiring pattern is formed and a predetermined circuit device is mounted, and is a printed board electrically connected to electronic component 130 and reactor 140 so as to configure a power conversion circuit (e.g., an electric circuit such as an inverter and an in-vehicle charger composed a DC/DC converter and a power factor improvement circuit). In particular, circuit board 110 of the present embodiment is a power conversion circuit having a high output capability that is compatible with a driving high voltage battery mounted in an electric vehicle or the like. Note that circuit board 110 is fixed at a boss (not illustrated in the drawing) protruding upward from the inner bottom surface of the bottom wall of heat dissipation housing 2 and/or the four corners of the upper end of case 120 with a screw or the like not illustrated.

As illustrated in FIG. 2, case 120 is composed of aluminum, and is formed by die casting into a box shape that opens upward (a cuboid shape composed of a bottom wall and four side walls) for example. In case 120, reactor 140 and spacer 141 are housed. In the side wall of case 120, screw hole 121 through which screw with resin 131 described later is inserted is formed.

In addition, in case 120, a fastening part for screw-fixing case 120 to heat dissipation housing 2 and a substrate contact part that makes contact with circuit board 110 are also formed. In the present embodiment, the fastening part is formed at four corners of the bottom wall of case 120, and the substrate contact part is formed at four corners of the upper surface of case 120 (at the upper end of the portion where each side wall is connected). Note that, while heat dissipation housing 2 and case 120 have a cuboid shape composed of the bottom wall and the four side walls (a cuboid shape that open only upward) in the present embodiment, this is not limitative, and heat dissipation housing 2 and case 120 may have a triangular prism shape composed of a bottom wall and three side walls, a hexagonal prism shape composed of a bottom wall and six side walls, or the like.

Electronic component 130 is a switching device such as a FET, a diode, or the like, for example. In the present embodiment, six electronic components 130 are provided as illustrated in FIG. 2, but, for the sake of simplifying the description, two electronic components 130, namely, electronic component 130A and electronic component 130B, are described below in accordance with the surfaces where electronic components 130 are attached. As elaborated later, electronic component 130A is fixed to the front side wall of case 120 through heat transfer member 150A with screw with resin 131, and is connected to circuit board 110 through lead A by soldering or the like. Electronic component 130B is fixed to the rear side wall of case 120 through heat transfer member 150B with screw with resin 131, and is connected to circuit board 110 through lead A by soldering or the like. Electronic component 130A corresponds to "first switching device" of the present disclosure, and electronic component 130B corresponds to "second switching device" of the present disclosure. Note that, electronic component 130 of the present embodiment is molded using an insulation resin (insert molding). That is, electronic component 130 is configured such that current leakage does not occur even when it is in contact with a conductive material (metal).

Reactor 140 is an electronic component including a coil wound around a core (omitted in the drawing), and is disposed in case 120 together with spacer 141. The area around reactor 140 in case 120 is filled with potting resin material P (see FIG. 3) as an example of a resin material having a heat-dissipation property. With case 120 filled with potting resin material P, the heat generated from reactor 140 is transmitted to case 120 through potting resin material P. As described later, the heat transmitted to case 120 is transmitted to heat dissipation housing 2 through heat transfer member 150. In this manner, the heat of reactor 140 is dissipated.

Further, potting resin material P has an insulating property and a curing property. With this configuration, reactor 140 can be fixed (as measures against vibration) while ensuring the insulation between reactor 140 and case 120 (aluminum). In addition, after potting resin material P is cured, the potting resin material does not flow out, and therefore case 120 can be rotated 90 degrees and housed in heat dissipation housing 2.

Here, electronic component 130 and reactor 140 are used for a power conversion circuit (such as an in-vehicle charger and an inverter), and generate heat when power conversion is performed. As illustrated in FIG. 2, reactor 140 has a volume greater than that of electronic component 130, and thus the main heat dissipation area (in the present embodiment, the bottom area of case 120 closest to heat dissipation housing 2) of case 120 can be largely ensured. In addition, since case 120 is filled with the above-described potting resin material P and no air is interposed in case 120, the heat of reactor 140 can be dissipated with a high heat-dissipation performance (thermal conductivity).

Specifically, regarding the relationship between the heat generation amount and the heat-dissipation performance (the heat dissipation area, the thermal conductivity to a radiator and the like), the heat-dissipation performance with respect to the heat generation amount (and heat resisting property) of electronic component 130 is poorer than that of reactor 140, and therefore a structure that dissipates the more heat of electronic component 130 is desired.

Heat transfer member 150 dissipates the heat of the above-described electronic component 130 and reactor 140, and is formed by bending, substantially at a right angle, a metal plate made of copper or the like having a thermal conductivity higher than that of case 120, for example. In the present embodiment, with respect to the bent portion as the starting point, the member is separately described as first portion 151 and second portion 152. In FIG. 2, the portion extending in the vertical direction is first portion 151, and the portion extending in the front-rear direction is second portion 152.

In addition, in the present embodiment, heat transfer member 150 is composed of two heat transfer members, namely, heat transfer member 150A and heat transfer member 150B. Each of heat transfer member 150A and heat transfer member 150B includes first portion 151 and second portion 152. Note that heat transfer member 150A corresponds to "first heat transfer member" of the present disclosure, and heat transfer member 150B corresponds to "second heat transfer member" of the present disclosure.

As illustrated in FIG. 3, heat transfer member 150A is disposed such that the surface (inner bent surface) of first portion 151 on second portion 152 side is in contact with one outer surface (first outer surface) of four side walls 122 of case 120. In addition, heat transfer member 150A is disposed such that the surface (inner bent surface) of second portion 152 on first portion 151 side is in contact with the outer surface (second outer surface) of bottom wall 123 of case 120.

Heat transfer member 150B is disposed such that the surface (inner bent surface) of first portion 151 on second portion 152 side is in contact with the outer surface (first outer surface) of wall 122 on the side opposite side wall 122 of case 120 that makes contact with first portion 151 of heat transfer member 150A. In addition, heat transfer member 150B is disposed such that the surface (inner bent surface) of second portion 152 on first portion 151 side is in contact with the outer surface (second outer surface) of bottom wall 123 of case 120.

In first portion 151 of each of heat transfer member 150A and heat transfer member 150B, screw hole 153 through which screw with resin 131 for attaching electronic component 130 is inserted is formed. Here, by screw-fixing with screw with resin 131 through electronic component 130A, screw hole 153 of heat transfer member 150A and screw hole 121 of case 120, electronic component 130A is fixed in contact with first portion 151 of heat transfer member 150A. Likewise, by screw-fixing with screw with resin 131 through electronic component 130B, screw hole 153 of heat transfer member 150B and screw hole 121 of case 120, electronic component 130B is fixed in contact with first portion 151 of heat transfer member 150B. Note that side wall 122 on the front side and side wall 122 on the rear side correspond to "first side wall and second side wall" of the present disclosure.

Second portion 152 is disposed such that second portion 152 is in contact with the outer surface (second outer surface) of bottom wall 123 of case 120 and with the inner surface of the bottom wall of heat dissipation housing 2. More specifically, by screw-fixing a fastening part formed in case 120 and the bottom wall of heat dissipation housing 2, the outer surface (second outer surface) of bottom wall 123 of case 120 and second portion 152 of each of heat transfer member 150A and heat transfer member 150B, and the inner surface of the bottom wall of heat dissipation housing 2 are press-fitted. When heat transfer member 150 is disposed in the above-described manner, heat generated by electronic component 130 is transmitted from first portion 151 to second portion 152 of heat transfer member 150 and then to heat dissipation housing 2. In addition, heat generated by reactor 140 is transmitted from bottom wall 123 of case 120 to second portion 152 of heat transfer member 150 and then to heat dissipation housing 2. In this manner, the heat of both electronic component 130 and reactor 140 is dissipated.

Here, when the heat of both electronic component 130 and reactor 140 is dissipated without interposing heat transfer member 150 therebetween, or in other words, when electronic component 130 is disposed such that electronic component 130 is in direct contact with side wall 122 of case 120, the heat of electronic component 130 and reactor 140 is dissipated through transmission of the heat from side wall 122 of case 120 to bottom wall 123.

Since the heat of both electronic component 130 and reactor 140 is transmitted to case 120, the thickness (in the horizontal direction: the front-rear-left-right direction) of side wall 122 is required to be set to a thickness corresponding to the heat generation amount of electronic component 130 and the heat generation amount of reactor 140. Here, when the thermal conductivity of the aluminum of case 120 is taken into consideration, the thickness of side wall 122 is required to be increased, and in turn, the installation area of case 120 in heat dissipation housing 2 is required to be ensured for the purpose of improving the heat dissipation efficiency. As a result, the size of the entire apparatus is required to be increased.

In view of this, in the present embodiment, heat transfer member 150, whose thermal conductivity is higher than that of case 120, is interposed therebetween such that the heat of electronic component 130 is dissipated mainly from heat transfer member 150 and that the heat of reactor 140 is dissipated from case 120 and second portion 152 of heat transfer member 150.

With this configuration, when the relationship between the heat generation amount and the heat-dissipation performance (the heat dissipation area, the thermal conductivity to a radiator and the like) is taken into consideration, the heat-dissipation performance of electronic component 130, whose heat-dissipation performance is poorer than that of reactor 140, can be improved, and the thicknesses of side wall 122 and bottom wall 123 of case 120 are not required to be increased. In addition, heat transfer member 150 has a thermal conductivity higher than that of case 120, and therefore the heat can be more favorably dissipated than a configuration in which the heat is dissipated using only case 120 even when the entire thickness of side wall 122 of case 120 and heat transfer member 150 is reduced. For example, the thermal conductivity of heat transfer member 150 composed of copper is about three times the thermal conductivity of aluminum that is used for the die casting of case 120.

In view of the foregoing, in comparison with the configuration in which the heat is dissipated using only case 120, the entire thickness of case 120 and heat transfer member 150 can be reduced, and thus downsizing of the entire apparatus can be achieved.

In particular, in the present embodiment, heat transfer member 150 is disposed such that second portion 152 of heat transfer member 150 overlaps bottom wall 123 of case 120 in the vertical direction (in other words, second portion 152 of heat transfer member 150 overlaps bottom wall 123 of case 120 in plan view).

That is, the installation position of the bottom surface of reactor 140 (case 120) having a larger margin of the heat-dissipation performance than electronic component 130 can overlap the heat dissipation position of electronic component 130 (second portion 152 of heat transfer member 150). As a result, the heat dissipation of electronic component 130 can be prioritized so as to improve the heat-dissipation performance of electronic component 130 than that of reactor 140, and the heat-dissipation performance of electronic component 130 can be improved without increasing the installation area (bottom area) of power conversion apparatus 100 since it is not necessary to provide an additional heat dissipation surface of electronic component 130.

In addition, the thickness of heat transfer member 150A on the front side and the thickness of heat transfer member 150B on the rear side are equal to each other. This prevents formation of a step between heat transfer members 150 on the front and rear sides when power conversion apparatus 100 is disposed to heat dissipation housing 2, and it is thus easy to bring power conversion apparatus 100 into contact with heat dissipation housing 2.

In addition, the end portion of second portion 152 of heat transfer member 150A on the front side and the end portion of second portion 152 of heat transfer member 150B on the rear side do not overlap each other. Further, the distance between the end portion of second portion 152 of heat transfer member 150A on the front side and the end portion of second portion 152 of heat transfer member 150B on the rear side is smaller than the distance between two reactors 140 arranged in the front-rear direction. With this configuration, second portion 152 is reliably present in the range of the front-rear direction of two reactors 140, and thus the heat dissipation efficiency thereof can be further improved. Note that heat transfer member 150A on the front side and heat transfer member 150B on the rear side may be integrally configured, or more specifically, may be composed of a single copper plate (heat transfer member 150).

Figure 4:
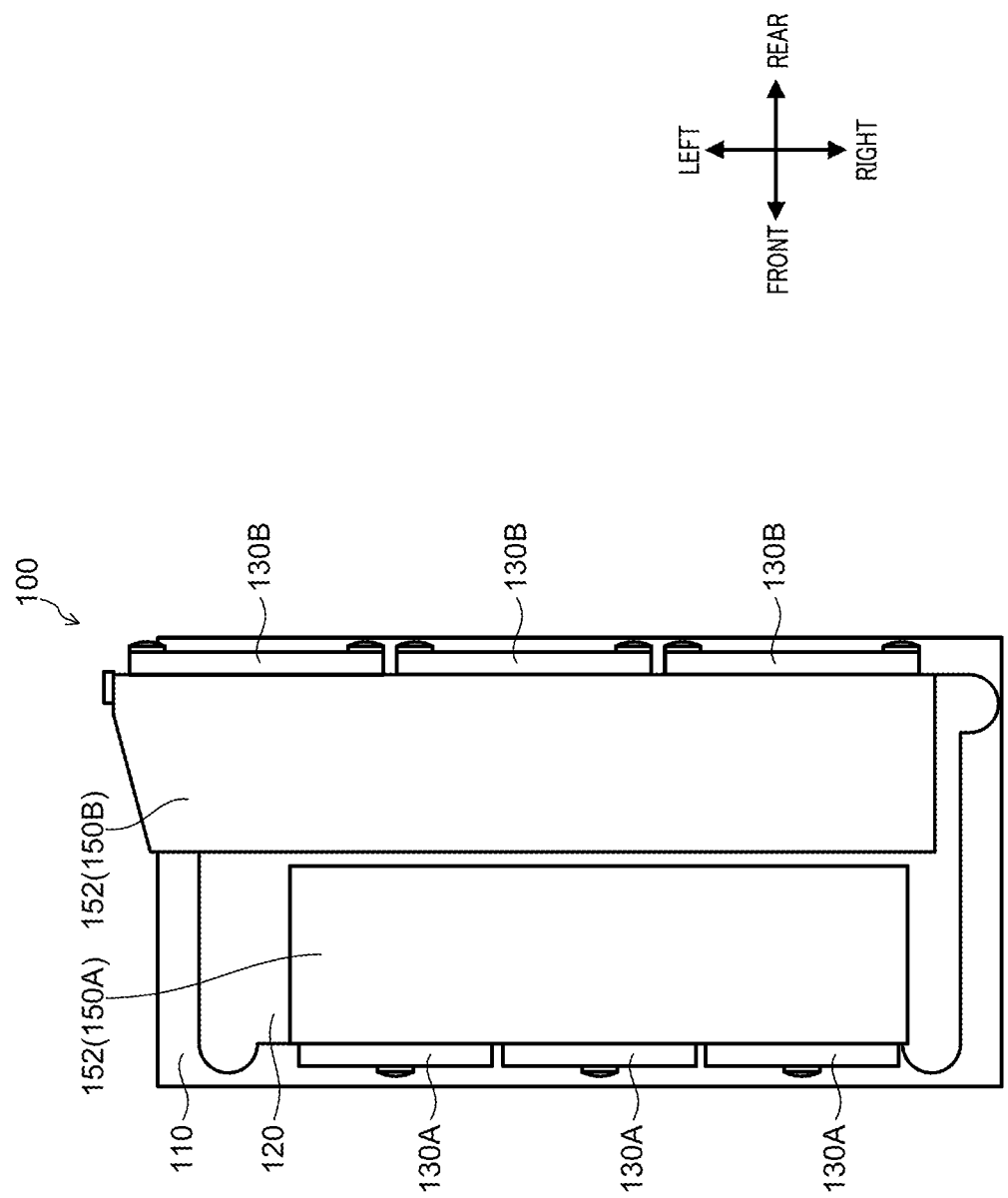
FIG. 4 is a bottom view of the power conversion apparatus.

In addition, as illustrated in FIG. 4, the width of heat transfer member 150 in the left-right direction may be appropriately adjusted in accordance with the width of electronic component 130 to be disposed. That is, the width of heat transfer member 150 in the left-right direction is equal to or greater than the width of electronic component 130 to be disposed. With this configuration, the heat of all electronic components 130 disposed in heat transfer member 150 can be transmitted to heat dissipation housing 2, and thus the heat dissipation efficiency can be further improved.

Note that, in the example illustrated in FIG. 4, the width of electronic component 130B disposed on the rear side is greater than the width of electronic component 130A disposed on the front side, and accordingly the width of heat transfer member 150B on the rear side is wider than the width of heat transfer member 150A on the front side.

According to the present embodiment having the above-mentioned configuration, by actively using heat transfer member 150 whose thermal conductivity is higher than that of case 120 to dissipate the heat of electronic component 130, the heat dissipation efficiency can be considerably improved, and further by utilizing the installation position of the bottom surface of reactor 140 (case 120) having a margin of the heat-dissipation performance as the heat dissipation surface of electronic component 130 (the installation position of heat transfer member 150), downsizing of the entire apparatus can be achieved without increasing the heat dissipation surface for electronic component 130. In addition, in comparison with the configuration in which the heat is dissipated using only case 120, the entire thickness of case 120 and heat transfer member 150 can be reduced, and thus downsizing of the entire apparatus can be achieved. That is, in the present embodiment, downsizing of the entire apparatus can be achieved while ensuring the heat-dissipation performance of electronic component 130 and reactor 140.

Incidentally, it is conceivable to form case 120 using only copper, but such a configuration is not realistic since, in comparison with aluminum, copper has a far higher fusing point and is less workable, and, requires a higher cost. More specifically, it is desirable to form, in case 120, a fastening part or the like for screw-fixing case 120 to heat dissipation housing 2 as described above. Die-casting, with copper, of case 120 having the above-described fastening part is difficult to work with and requires high costs. On the other hand, when it is molded by forging, the fastening part for screwing is difficult to form, and the bending portion of copper is arched, thus upsizing case 120.

However, in the present embodiment, heat transfer member 150 is formed by bending copper, and thus the heat dissipation efficiency of power supply apparatus 1 can be simply improved.

In addition, since heat transfer member 150 is configured to include first portion 151 and second portion 152, it is easy to dispose in contact with both side wall 122 and bottom wall 123 of case 120.

In addition, since screw hole 121 is formed in side wall 122 of case 120, the potting resin material may leak from screw hole 121, but since screw with resin 131 is inserted to screw hole 121, leakage of the potting resin material from screw hole 121 can be suppressed.

In addition, since two heat transfer members 150 can be disposed on the front side and the rear side of case 120, a larger number of electronic components 130 can be disposed.

Figure 5:
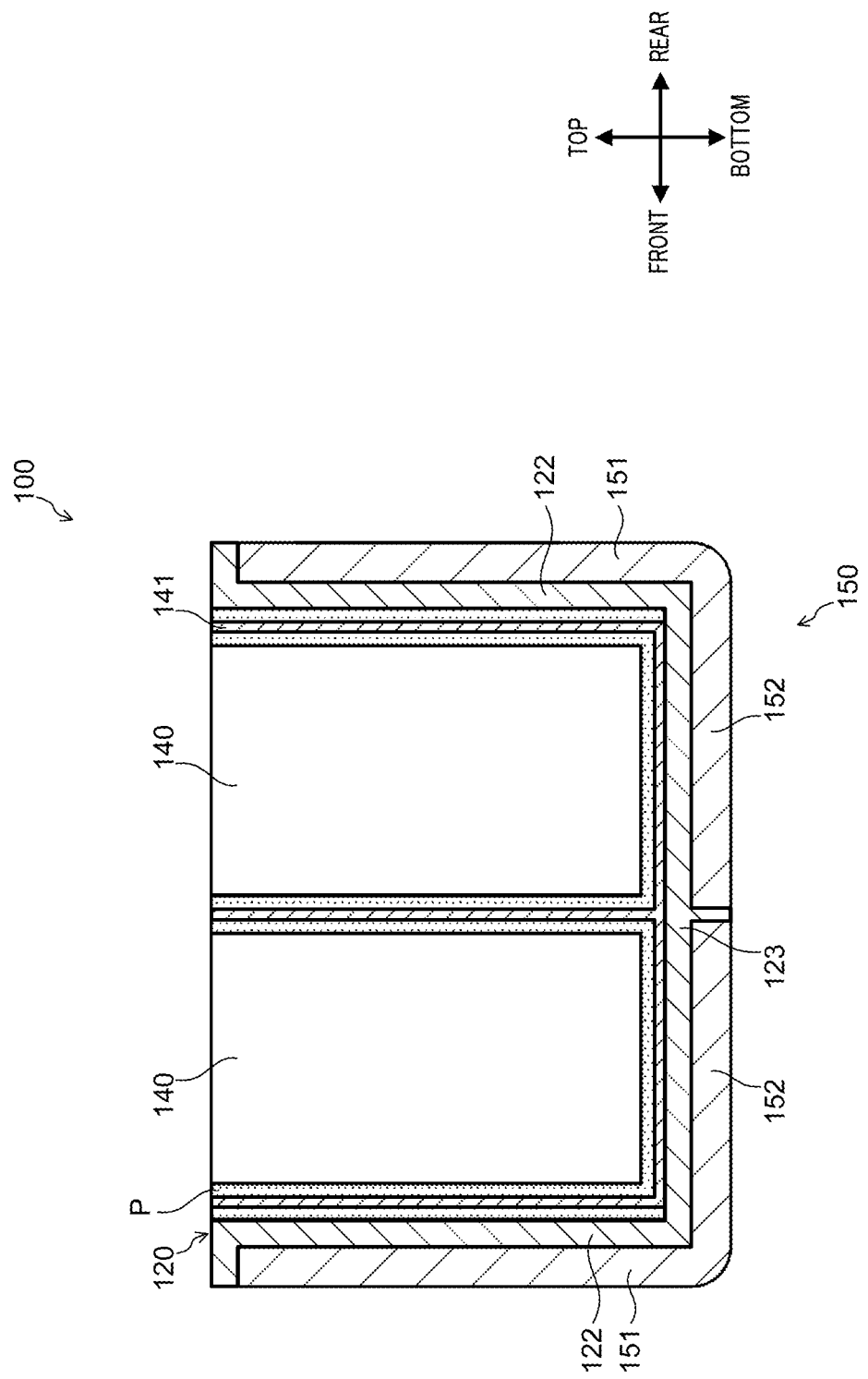
FIG. 5 is a side sectional view of a power conversion apparatus according to Modification 1.

Next, Modification 1 is described. FIG. 5 is a side sectional view of power conversion apparatus 100 according to the Modification 1. While case 120 is composed of a metal such as aluminum in the above-described present embodiment, case 120 is composed of resin in the Modification 1 as illustrated in FIG. 5. Heat transfer member 150 is fitted to case 120 by insert molding.

Such a configuration can also improve the heat dissipation efficiency, since the heat dissipation of electronic component 130 can be achieved by heat transfer member 150 alone and the heat dissipation of reactor 140 can be achieved by case 120 and second portion 152 of heat transfer member 150. In addition, as in the above-described present embodiment, heat transfer member 150 may be brought into contact with the outer surface of case 120 composed of resin. Note that when case 120 is composed of resin, it suffices that heat transfer member 150 has a thermal conductivity higher than that of resin, and may be composed of aluminum, for example.

Figure 6:
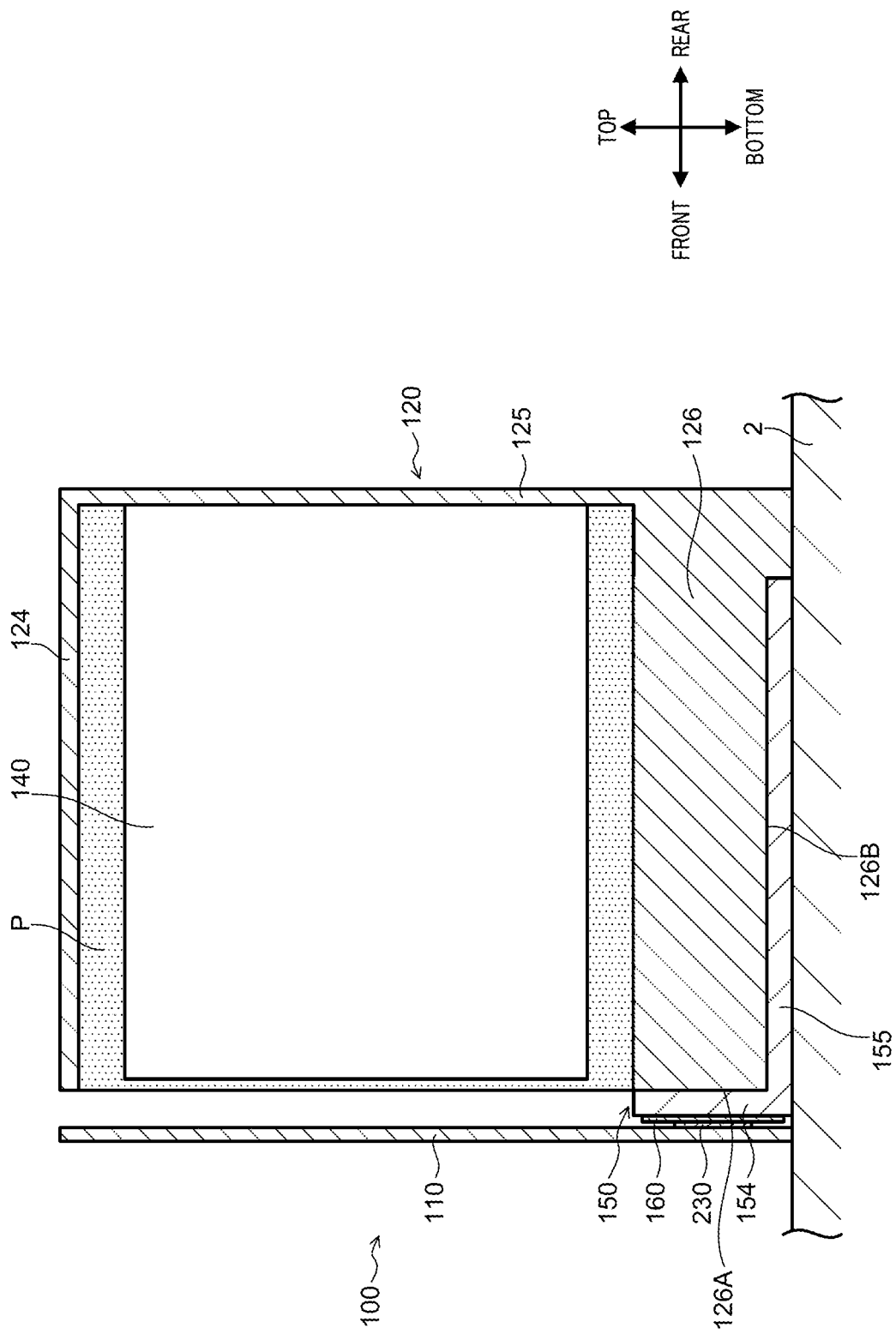
FIG. 6 is a side sectional view of a power conversion apparatus according to Modification 2.

Next, Modification 2 is described. FIG. 6 is a side sectional view of power conversion apparatus 100 according to the Modification 2.

As illustrated in FIG. 6, case 120 of power conversion apparatus 100 according to the Modification 2 is composed of top wall 124, side wall 125, and bottom wall 126, and is configured such that reactor 140 can be housed from an opening that opens in the front direction (the direction orthogonal to the vertical direction). In addition, circuit board 110 is disposed at a position opposite the opening at the front end of case 120. Note that, side wall 125 is disposed to surround the space between top wall 124 and bottom wall 126, but FIG. 6 illustrates only the part connecting between the rear end portion of top wall 124 and the rear end portion of bottom wall 126. In addition, the space between top wall 124 and bottom wall 126 is filled with potting resin material P. In addition, circuit board 110 is fixed with screws not illustrated or the like at fastening parts formed in left and right end portions of the front lower end portion of case 120.

Heat transfer member 150 is disposed in contact with lower edge surface 126A (first outer surface) at the opening in bottom wall 126 and bottom surface 126B (second outer surface) of bottom wall 126. That is, first portion 154 of heat transfer member 150 is in contact with lower edge surface 126A, and second portion 155 of heat transfer member 150 is in contact with bottom surface 126B. Such a configuration can also improve the heat dissipation efficiency of power supply apparatus 1.

In addition, electronic component 230 is fixed to first portion 154 through sheet 160. Electronic component 230 may be fixed to first portion 154 with a screw, or may be fixed to first portion 154 with an adhesive agent or the like. For example, sheet 160 is made of graphite, and has a thermal conductivity higher than that of case 120. With such a sheet 160, the heat of electronic component 230 can be easily transmitted to heat transfer member 150. Note that, such a member made of graphite may be applied to heat transfer member 150.

Note that, in the present embodiment, heat transfer member 150 is provided with first portion 151 and second portion 152 by bending a copper plate, the present disclosure is not limited to this, and the first portion and the second portion may be composed of separate members, for example.

In addition, while heat dissipation housing 2 has a box-shaped configuration including fin 2A in the present embodiment, any configuration may be adopted as long as the heat of electronic component 130 and reactor 140 can be dissipated.

In addition, while electronic component 130 is fixed to case 120 and heat transfer member 150 with screw with resin 131 in the present embodiment, the present disclosure is not limited to this, and electronic component 130 may be fixed by other ways.

In addition, while first portion 151 of heat transfer member 150 is in contact with the first outer surface of side wall 122 of case 120, and second portion 152 of heat transfer member 150 is in contact with the second outer surface of bottom wall 123 of case 120 in the above-described present embodiment (the configurations illustrated in FIG. 1 to FIG. 4), the present disclosure is not limited to this. For example, the first outer surface and the second outer surface may be any outer surfaces in case 120 as long as they are different surfaces which are connected to each other in case 120.

Note that, while the electronic component is molded using an insulation resin (insert molding) in the above-described present embodiment, an electronic component whose heat dissipation surface is not molded (not insulated) using an insulation resin may also be used for the purpose of further improving the heat-dissipation performance.

In this case, it is preferable to insulate heat transfer member 150 such that the uninsulated heat dissipation surface of the electronic component does not directly make contact with heat transfer member 150 (copper plate).

Hot pressing process, powder application and the like may be included in the insulation process, for example. In particular, the hot pressing process is difficult to provide to box-shaped heat dissipation housing 2 (aluminum die casting case), but can be easily provided to a metal plate (copper plate).

That is, by using a metal plate as heat transfer member 150, the insulation process can be easily provided, and the electronic component that is not molded using an insulation resin can be easily used. With this configuration, heat is dissipated through a resin (insulation process) having a thickness smaller than the thickness of the resin of the molded electronic component, and thus the heat-dissipation performance can be further improved.

Note that it suffices that at least a part that makes contact with the electronic component is provided with the insulation process.

Note that case 120 may be composed of a carbon fiber or the like, rather than aluminum.

Note that while power conversion apparatus 100 is exemplified in the present embodiment, the present disclosure is not limited to this, and a power supply apparatus that does not perform power conversion is also applicable.

Next, Embodiment 2 is described. While a structure in which case 120 is formed by aluminum die casting into a box shape (a cuboid shape composed of the bottom wall and the four side walls) is exemplified and case 120 is filled with potting resin material P in the above-described present embodiment, other structures may also be adopted.

Incidentally, in the case where case 120 is composed of a material having a high thermal conductivity such as copper, it is difficult to perform a process of molding a fixing part for fixing case 120 to heat dissipation housing 2 by screwing and the like, or the cost is significantly increased. Therefore, in the above-described present embodiment, case 120 is molded with a material that is easier to shape than the heat transfer member, and then the heat transfer member (e.g., copper) having a high thermal conductivity is combined thereto.

As described above, rather than molding the "case" that can be filled with potting resin material P with a material that is easier to shape, only the "fixing part" for fixing to heat dissipation housing 2 by screwing may be molded with a material that is easier to shape. Then, a case that can be filled with potting resin material P may be configured by combining the fixing part and the heat transfer member.

Figure 7:
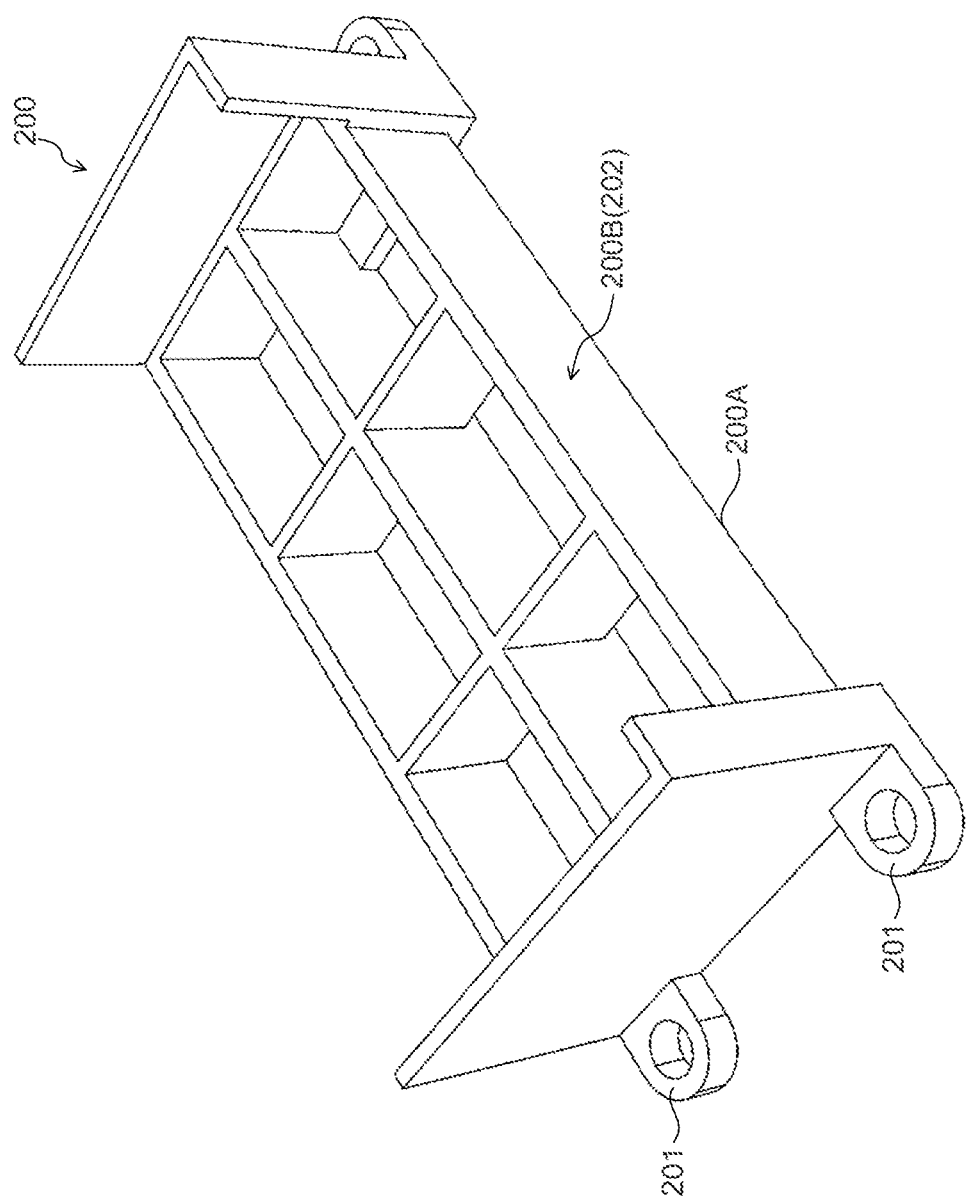
FIG. 7 is a perspective view of a fixing member according to Embodiment 2.

More specifically, fixing member 200 is used as illustrated in FIG. 7. Fixing member 200 includes fixing part 201 (fastening part) for fixing to heat dissipation housing 2 with a screw or the like, and is molded so as to have a housing space in which a reactor can be housed. Fixing member 200 mainly functions to fix reactor 140 (a fixing member in which reactor is housed) to heat dissipation housing 2. With fixing member 200 alone, potting resin material P cannot be filled (potting resin material P leaks) since bottom surface 200A has an opening.

Figure 8:
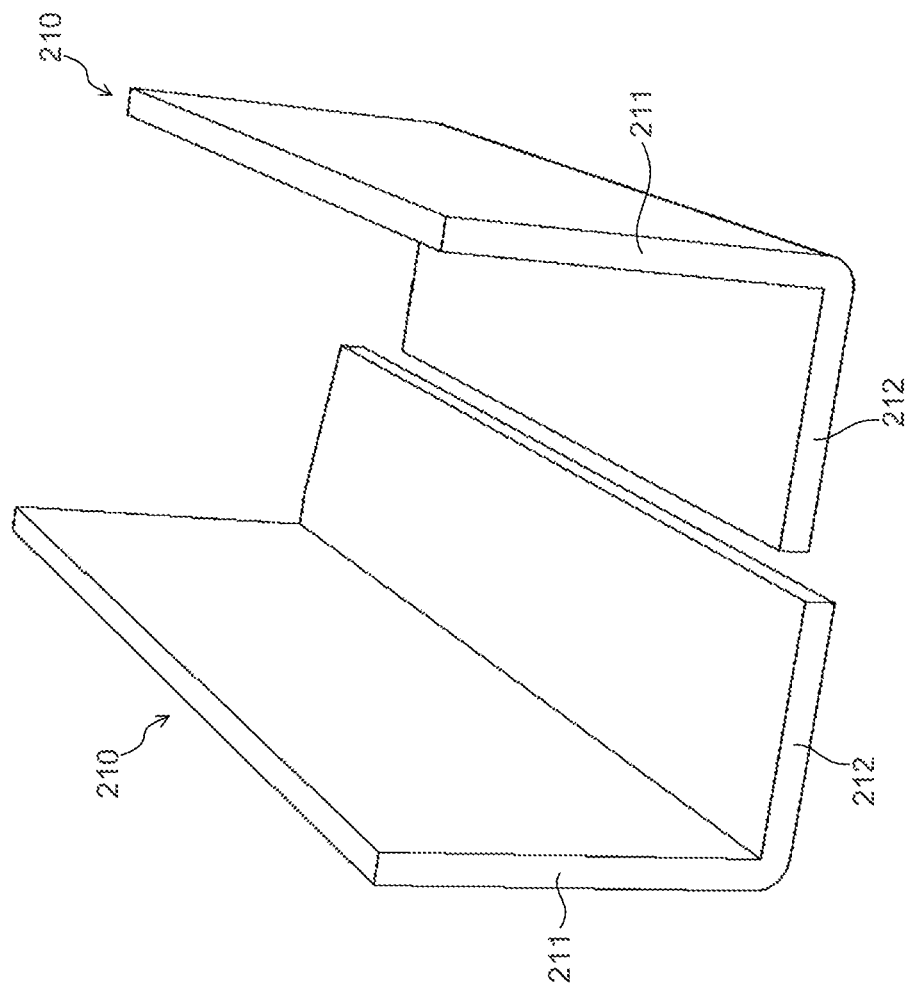
FIG. 8 is a perspective view of a heat transfer member according to Embodiment 2.
Figure 9:
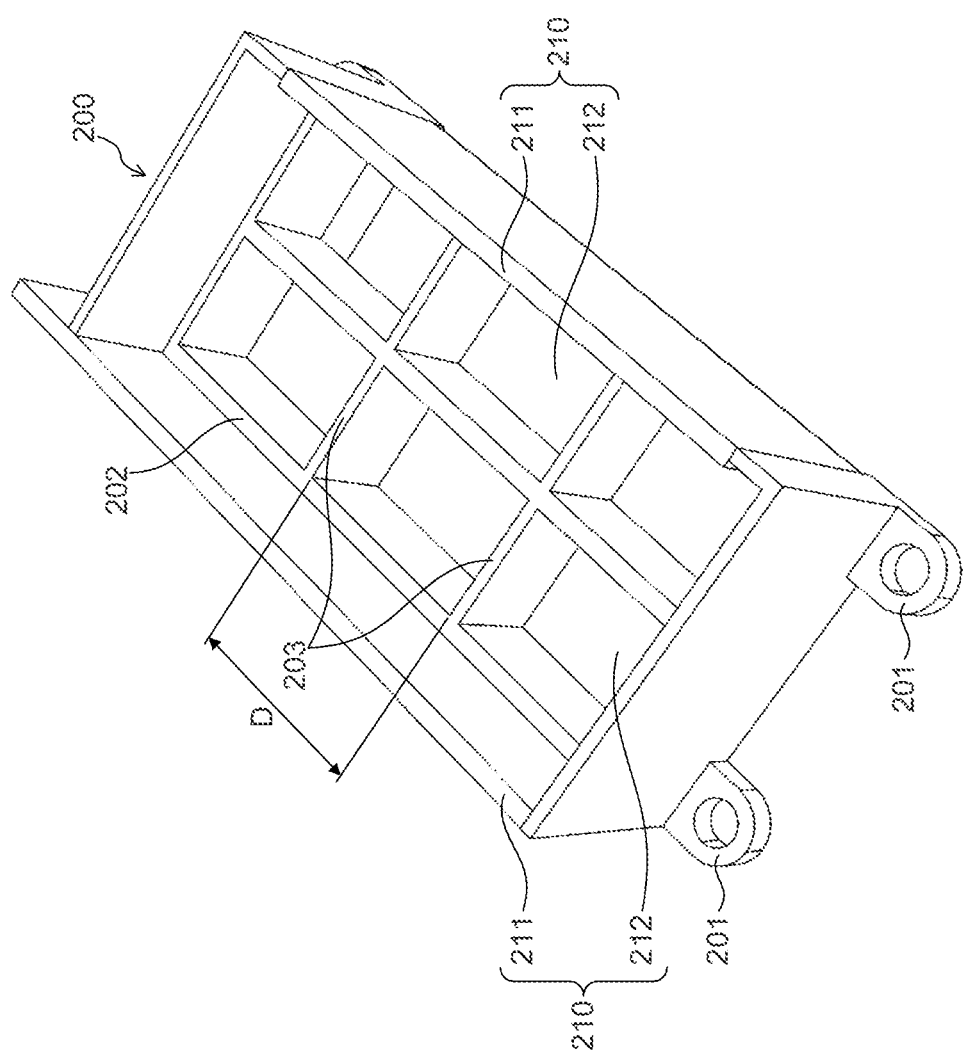
FIG. 9 is a perspective view of the fixing member and the heat transfer member according to Embodiment 2.

In Embodiment 2, heat transfer member 210 (e.g., copper) having a high thermal conductivity is insert-molded (shaped) so as to cover the opening of bottom surface 200A of fixing member 200. As illustrated in FIG. 8, heat transfer member 210 includes first portion 211 disposed along side surface 200B of side wall 202 of fixing member 200, and second portion 212 that covers the opening, in contact with bottom surface 200A. With this configuration, as illustrated in FIG. 9, bottom surface 200A and side surface 200B of fixing member 200 is covered with heat transfer member 210, and thus a case that can be filled with potting resin material P (without causing leakage) is formed. Note that fixing member 200 and heat transfer member 210 may be joined by using an adhesive agent or the like as well as by insert molding.

In addition, fixing member 200 includes partition plate 203 that partitions a housing space for housing reactor 140. Width D of the housing space partitioned by partition plate 203 is smaller than the diameter of reactor 140.

Figure 10:
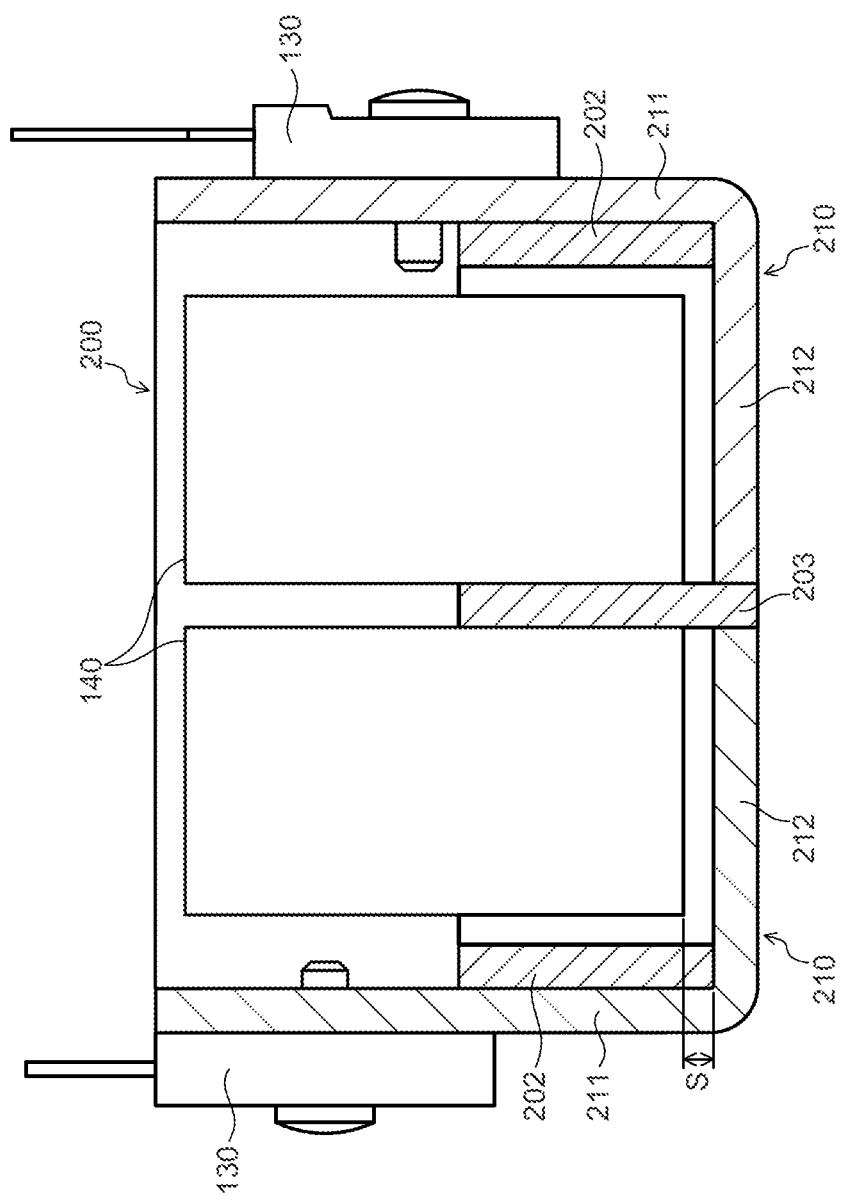
FIG. 10 is a side sectional view of a power conversion apparatus according to Embodiment 2.

As illustrated in FIG. 10, when reactor 140 is housed between partition plates 203, partition plate 203 defines the height of reactor 140 in the vertical direction. This height is defined such that space S is set between the reactor and heat transfer member 210 covering the bottom surface. With this configuration, even in the case where heat transfer member 210 is composed of a metal (such as copper and aluminum) having conductivity, insulation between reactor 140 and heat transfer member 210 can be ensured.

Figure 11:
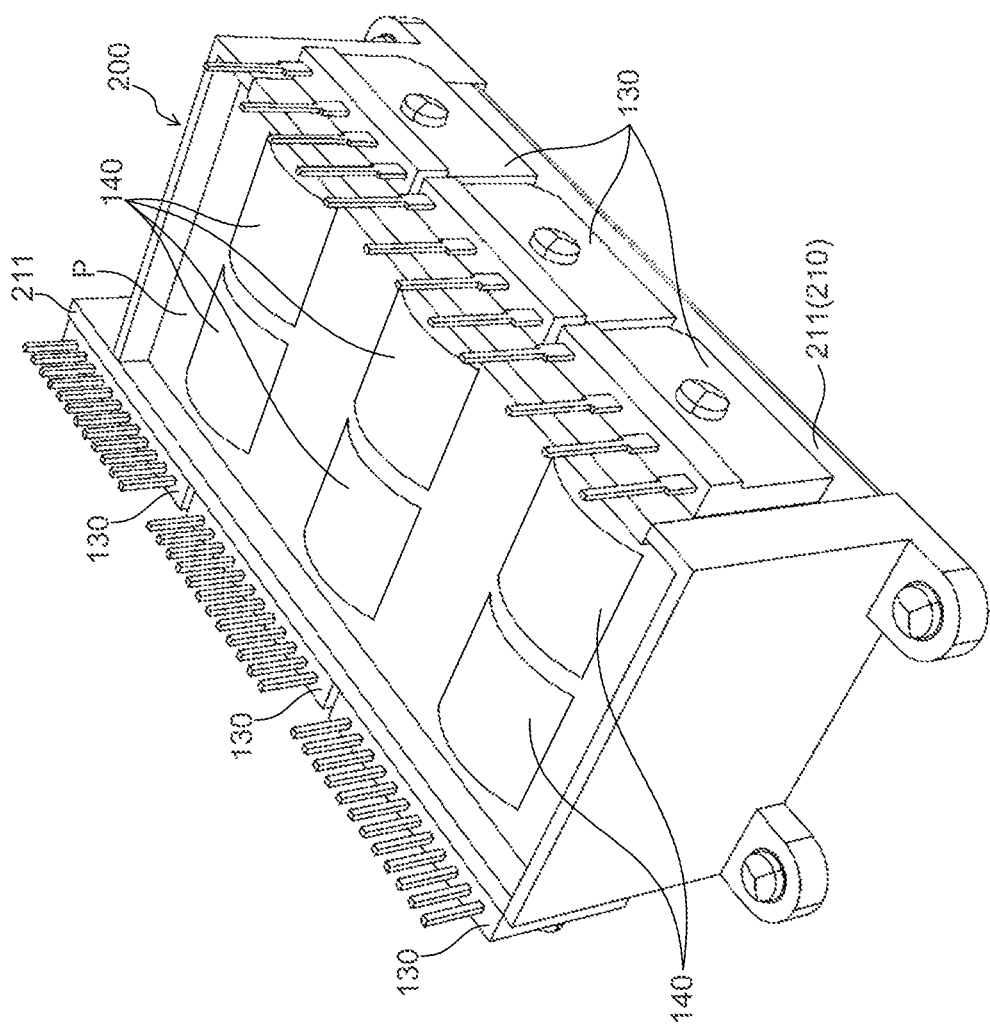
FIG. 11 is a perspective view of the power conversion apparatus according to Embodiment 2.

Then, as illustrated in FIG. 11, as in the above-described present embodiment, electronic component 130 is fixed by bonding to heat transfer member 210, and a case composed of fixing member 200 and heat transfer member 210 (see FIG. 9) is filled with a heat-dissipation resin (potting resin). Then, fixing to heat dissipation housing 2 is performed by screwing or the like with fixing part 201 of fixing member 200. When fixing part 201 is fastened, thermal bonding between heat transfer member 210 and heat dissipation housing 2 is further ensured, and thus downsizing of the entire apparatus can be achieved while ensuring the heat-dissipation performance of electronic component 130 and reactor 140 as in the above-mentioned embodiment.

Note that, according to Embodiment 2, the manufacturing cost can be reduced in comparison with the case where case 120 is molded by aluminum die casting as in the above-described present embodiment. In addition, according to Embodiment 2, the size can be further reduced since the thickness can be reduced in comparison with aluminum die casting.

Note that it is preferable that heat transfer member 210 is composed of a member having a thermal conductivity higher than that of the member (e.g., aluminum) of the housing.

In addition, while the first portion of heat transfer member 150 is disposed in contact with the first outer surface (side surface) of case 120 in Embodiment 1, the first portion may not be in contact with the first outer surface (side surface) in the case. It should be noted that, when the first portion is in contact with the first outer surface (side surface), the size can be reduced since no space is formed between the heat transfer member (first portion) and the first outer surface, and the heat-dissipation performance (thermal conductivity) is preferable since the heat of the reactor can be transferred through the heat transfer member.

While the invention made by the present inventor has been specifically described based on the preferred embodiments, it is not intended to limit the present invention to the above-mentioned preferred embodiments but the present invention may be further modified within the scope and spirit of the invention defined by the appended claims.

This application is entitled to and claims the benefit of Japanese Patent Application No. 2018-084184 filed on Apr. 25, 2018, the disclosure each of which including the specification, drawings and abstract is incorporated herein by reference in its entirety.

INDUSTRIAL APPLICABILITY

The power supply apparatus of the present disclosure is useful as a power supply apparatus that can reduce the size of the entire apparatus while ensuring the heat-dissipation performance of the heating member.

REFERENCE SIGNS LIST

1 Power supply apparatus
2 Heat dissipation housing
2A Fin
3 Lid
100 Power conversion apparatus
110 Circuit board
120 Case
121 Screw hole
122 Side wall
123 Bottom wall
130 Electronic component
131 Screw with resin
140 Reactor
150 Heat transfer member
151 First portion
152 Second portion
153 Screw hole

The invention claimed is:

1. A power supply apparatus comprising:
a first heating member;
a case having a box shape whose one surface is open, the case being configured to house the first heating member;
a resin material provided inside the case, and configured to transmit heat of the first heating member to the case;
a circuit board;
a second heating member connected to the circuit board; and
a heat dissipation housing configured to house the case, the circuit board and the second heating member and dissipate heat of the first heating member and the second heating member,
a heat transfer member having a thermal conductivity higher than that of the case, the heat transfer member including a first portion disposed in contact with a first outer surface of the case, and a second portion disposed in contact with the heat dissipation housing, and
wherein the second heating member is disposed in contact with the heat transfer member.

2. The power supply apparatus according to claim 1, wherein:
the case has a cuboid shape with a bottom wall and four side walls;
the first outer surface includes outer surfaces of a first side wall and a second side wall of the four side walls, the second side wall being opposite to the first side wall;
a second outer surface of the case is an outer surface of the bottom wall and the second outer surface is in contact with the second portion of the heat transfer member;
the heat transfer member includes a first heat transfer member and a second heat transfer member, the first heat transfer member being disposed in contact with the outer surface of the first side wall and the second outer surface, the second heat transfer member being disposed in contact with the outer surface of the second side wall and the second outer surface such that the second heat transfer member does not overlap the first heat transfer member; and
the second heating member includes a first switching device disposed in contact with a first portion of the first heat transfer member, and a second switching device disposed in contact with a first portion of the second heat transfer member.

3. The power supply apparatus according to claim 2, wherein the heat transfer member is disposed such that the second portion of the heat transfer member overlaps the bottom wall of the case in plan view.

4. The power supply apparatus according to claim 1, wherein:
the case includes a top wall, a side wall and a bottom wall, and is configured to house the first heating member from an opening that is open in a direction orthogonal to a vertical direction;
the first outer surface is an edge surface of the bottom wall at the opening; and
the second portion includes a surface that is in contact with a second outer surface of the bottom wall.

5. The power supply apparatus according to claim 1, wherein:
the case is composed of aluminum molded by die-casting; and
the heat transfer member is composed of a copper plate.

6. The power supply apparatus according to claim 1, wherein the second heating member is fixed and disposed to the case and the heat transfer member with a screw with resin.

7. The power supply apparatus according to claim 1, wherein the case is composed of a resin.

8. The power supply apparatus according to claim 7, wherein the heat transfer member is fitted to the case by insert molding.

9. The power supply apparatus according to claim 1, wherein the first heating member has a volume greater than that of the second heating member.

10. The power supply apparatus according to claim 1, wherein a width of the heat transfer member is equal to or greater than a width of the second heating member.

11. The power supply apparatus according to claim 1, wherein the second heating member is fixed and disposed to the case and the heat transfer member with a screw.

12. A power supply apparatus comprising:
a first heating member;
a case having a box shape whose one surface is open, the case being configured to house the first heating member;
a resin material provided inside the case, and configured to transmit heat of the first heating member to the case;
a circuit board;
a second heating member connected to the circuit board; and
a heat dissipation housing configured to house the case, the circuit board and the second heating member and dissipate heat of the first heating member and the second heating member,
wherein the power supply apparatus further includes a heat transfer member having a thermal conductivity higher than that of the case, the heat transfer member including a first portion disposed and thermally connected to a first outer surface of the case, and a second portion disposed and thermally connected to the heat dissipation housing, and
wherein the second heating member is disposed in contact with the heat transfer member.

13. The power supply apparatus according to claim 12, wherein:
the case is composed of aluminum molded by die-casting; and
the heat transfer member is composed of a copper plate.

14. The power supply apparatus according to claim 12, wherein the case is composed of a resin.

15. The power supply apparatus according to claim 14, wherein the heat transfer member is fitted to the case by insert molding.

16. A power supply apparatus comprising:
a first heating member;
a case having a box shape whose one surface is open, the case being configured to house the first heating member;
a resin material provided inside the case, and configured to transmit heat of the first heating member to the case;
a circuit board;
a second heating member connected to the circuit board; and
a heat dissipation housing configured to house the case, the circuit board and the second heating member and dissipate heat of the first heating member and the second heating member,
wherein the power supply apparatus further includes a heat transfer member having a thermal conductivity higher than that of the case, the heat transfer member disposed in contact with a first outer surface of the case,
wherein the second heating member is disposed in contact with the heat transfer member, and
wherein the heat transfer member is disposed in contact with a wall surface of the heat dissipation housing such that the heat transfer member is thermally connected to the heat dissipation housing.

17. The power supply apparatus according to claim 16, wherein:
the case is composed of aluminum molded by die-casting; and
the heat transfer member is composed of a copper plate.

18. The power supply apparatus according to claim 16, wherein the case is composed of a resin.

19. The power supply apparatus according to claim 18, wherein the heat transfer member is fitted to the case by insert molding.

* * * * *